(12) United States Patent
Park

(10) Patent No.: US 12,171,070 B2
(45) Date of Patent: *Dec. 17, 2024

(54) DISPLAY MODULE AND DISPLAY DEVICE

(71) Applicant: LG Display Co., Ltd., Seoul (KR)

(72) Inventor: Chanhyeok Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/471,632

(22) Filed: Sep. 21, 2023

(65) Prior Publication Data

US 2024/0015895 A1 Jan. 11, 2024

Related U.S. Application Data

(63) Continuation of application No. 18/316,777, filed on May 12, 2023, which is a continuation of application No. 17/530,845, filed on Nov. 19, 2021, now Pat. No. 11,690,182.

(30) Foreign Application Priority Data

Dec. 24, 2020 (KR) .................. 10-2020-0183760

(51) Int. Cl.
*G09F 9/00* (2006.01)
*H05K 5/00* (2006.01)
*H05K 5/03* (2006.01)

(52) U.S. Cl.
CPC ............. *H05K 5/0017* (2013.01); *H05K 5/03* (2013.01)

(58) Field of Classification Search
None
See application file for complete search history.

(56) References Cited

U.S. PATENT DOCUMENTS

| | | | |
|---|---|---|---|
| 9,274,360 B2 | 3/2016 | Oh et al. | |
| 9,541,961 B1 | 1/2017 | Buxton et al. | |
| 9,616,625 B2* | 4/2017 | Allore | H04M 1/026 |
| 9,698,362 B2 | 7/2017 | Kim | |
| 10,076,890 B2 | 9/2018 | Oh et al. | |
| 10,321,590 B2* | 6/2019 | Cater | H01Q 1/24 |
| 10,462,896 B1* | 10/2019 | Kwon | G06F 1/1626 |

(Continued)

FOREIGN PATENT DOCUMENTS

| | | |
|---|---|---|
| CN | 103137022 A | 6/2013 |
| CN | 105655371 A | 6/2016 |

(Continued)

*Primary Examiner* — Xanthia C Relford
(74) *Attorney, Agent, or Firm* — Seed IP Law Group LLP

(57) ABSTRACT

A display module and a display device which can improve a heat-dissipation performance and a shock absorption function while reducing a bezel area, and in particular, reduce an impact applied to an edge of a cushion plate, and reduce deterioration in the shock absorption function due to moisture. A chamfer is formed along an edge of a metal foam included in the cushion plate to implement the improvement. Thus, a spacing between the edge of the cushion plate and a frame is maximized such that the impact applied to the edge of the cushion plate can be reduced as much as possible. Further, a rear face of a body and a chamfer of the metal foam can be covered with a water-proof layer, such that moisture invasion into the cushion plate can be reduced as much as possible.

37 Claims, 21 Drawing Sheets

(56) References Cited

U.S. PATENT DOCUMENTS

| | | | |
|---|---|---|---|
| 10,915,151 B2* | 2/2021 | Silvanto | H04M 1/0202 |
| 11,087,110 B2 | 8/2021 | Park et al. | |
| 2006/0152905 A1 | 7/2006 | Kim et al. | |
| 2010/0230155 A1 | 9/2010 | Hashizume et al. | |
| 2011/0261517 A1* | 10/2011 | Fuke | H04M 1/18 |
| | | | 361/679.01 |
| 2012/0175165 A1* | 7/2012 | Merz | G06F 1/1656 |
| | | | 174/50 |
| 2012/0319140 A1* | 12/2012 | Hsu | H10K 77/10 |
| | | | 257/E33.012 |
| 2013/0027892 A1 | 1/2013 | Lim et al. | |
| 2014/0078719 A1 | 3/2014 | Jung et al. | |
| 2014/0240911 A1* | 8/2014 | Cole | B29D 11/00009 |
| | | | 361/679.3 |
| 2014/0307396 A1 | 10/2014 | Lee | |
| 2015/0003011 A1 | 1/2015 | Peters et al. | |
| 2015/0192951 A1 | 7/2015 | Chong et al. | |
| 2016/0093644 A1 | 3/2016 | Ki et al. | |
| 2017/0036914 A1 | 2/2017 | Sohn et al. | |
| 2019/0101960 A1* | 4/2019 | Silvanto | G06F 1/1616 |
| 2019/0174658 A1 | 6/2019 | Qi et al. | |
| 2019/0207130 A1 | 7/2019 | He et al. | |
| 2019/0278411 A1 | 9/2019 | Jeon et al. | |
| 2019/0357366 A1 | 11/2019 | Choi et al. | |
| 2020/0057472 A1 | 2/2020 | Kang et al. | |
| 2020/0154605 A1 | 5/2020 | Bozorgi | |
| 2020/0169623 A1 | 5/2020 | Shin | |
| 2020/0194516 A1 | 6/2020 | Kim et al. | |
| 2020/0194710 A1 | 6/2020 | Zhao et al. | |
| 2020/0227504 A1* | 7/2020 | Luo | H10K 50/841 |
| 2020/0249723 A1 | 8/2020 | Mizoguchi et al. | |
| 2020/0303276 A1 | 9/2020 | Hwang et al. | |
| 2020/0325952 A1 | 10/2020 | Ryu et al. | |
| 2020/0393872 A1 | 12/2020 | Lim et al. | |
| 2021/0097253 A1 | 4/2021 | Kim et al. | |
| 2021/0168231 A1* | 6/2021 | Baker | H05K 1/189 |
| 2021/0291497 A1 | 9/2021 | Shin et al. | |
| 2021/0319724 A1 | 10/2021 | Jang | |
| 2021/0336161 A1 | 10/2021 | Xiang | |
| 2021/0342567 A1 | 11/2021 | Park et al. | |
| 2021/0356996 A1 | 11/2021 | Zhu | |
| 2021/0378155 A1 | 12/2021 | Qin | |
| 2022/0019114 A1* | 1/2022 | Friedman | B32B 5/024 |
| 2022/0154467 A1* | 5/2022 | Mort | B32B 5/18 |
| 2022/0201879 A1 | 6/2022 | Kwak et al. | |
| 2023/0127432 A1 | 4/2023 | Huang et al. | |

FOREIGN PATENT DOCUMENTS

| | | |
|---|---|---|
| CN | 108646462 A | 10/2018 |
| CN | 109147592 A | 1/2019 |
| CN | 109860240 A | 6/2019 |
| CN | 209170514 U | 7/2019 |
| CN | 110896654 A | 3/2020 |
| CN | 111128011 A | 5/2020 |
| CN | 111211146 A | 5/2020 |
| CN | 111324182 A | 6/2020 |
| KR | 20060055107 A | 5/2006 |
| KR | 101614139 B1 | 4/2016 |
| KR | 20180079044 A | 7/2018 |
| KR | 20190011865 A | 2/2019 |
| KR | 20190105682 A | 9/2019 |
| KR | 20200002456 A | 1/2020 |
| KR | 102113483 B1 | 5/2020 |
| KR | 20200101559 A | 8/2020 |
| KR | 20200129646 A | 11/2020 |

\* cited by examiner

DISPLAY MODULE AND DISPLAY DEVICE

CROSS-REFERENCE TO RELATED APPLICATION

This application claims a benefit under 35 U.S.C. § 119(a) of Korean Patent Application No. 10-2020-0183760 filed on Dec. 24, 2020, in the Korean Intellectual Property Office, the entire disclosure of which is incorporated herein by reference for all purposes.

BACKGROUND

Technical Field

The present disclosure relates to a display module and a display device, and more specifically, a display module and a display device capable of improving heat-dissipation performance and shock absorption function while reducing a bezel area.

Description of the Related Art

A display device is implemented in a wide variety of forms as in televisions, monitors, smart phones, tablet PCs, notebook computers, and wearable devices.

In general, the display device includes a display area displaying a image and a non-display area along an outer periphery of the display area.

The display device includes various additional components such as a driving integrated circuit or a circuit board in addition to a display panel to display the screen.

In the non-display area, the additional components can be disposed, or various connection parts such as a flexible circuit board for connecting the additional components to each other can be disposed.

In the display device, the non-display area is also referred to a bezel area. When the bezel area is thick, a user's gaze is wide. However, when the bezel area is thinner, the user's gaze is fixed on the screen of the display area such that user immersion increases.

In other words, when the bezel area becomes thinner, an entire size of the display device can be reduced while increasing the user immersion. Accordingly, demand from the user for the display device that can reduce the bezel area as much as possible is increasing.

BRIEF SUMMARY

In the display device, not only a pad of the display panel but also various additional components such as the driving integrated circuit and the circuit board can be disposed on a rear face (or a rear surface) of the display panel in order to secure the display area as large as possible and to ensure the minimum bezel area.

In this case, the various additional components can be mounted on or connected to a connection component such as a flexible circuit board and can be disposed on the rear face of the display panel.

For example, the flexible circuit board connected to one distal end of the display panel can be bent in a direction from the bezel area to the rear face of the display panel.

Alternatively, as one distal end of the display panel is bent toward the rear face of the display panel, the various additional components can be disposed on the rear face of the display panel.

In this case, when a radius of curvature of the bending distal end increases, the flexible circuit board or display panel can be bent more stably and easily. However, as the bending radius of curvature increases, the bezel area increases, and a total width of the display device increases.

A cushion plate for heat-dissipation and shock absorption can be disposed on the rear face of the display panel.

In one example, the cushion plate has a laminated structure in which a plurality of layers having various functions such as a heat-dissipation layer having a heat-dissipation function, a cushion layer capable of absorbing shock, an adhesive layer for bonding the heat-dissipation layer and the cushion layer to each other, etc., are laminated one on top of another.

In this case, when a thickness of each of the heat-dissipation layer and the cushion layer is as thick as possible, the heat-dissipation function and shock absorption function can increase. However, as the thickness thereof increases, a total thickness of the display device increases, resulting in an increase in the bezel area.

Otherwise, when the thickness of each of the heat-dissipation layer and the cushion layer is thin to reduce the total thickness of the display device, the heat-dissipation function and the shock absorbing function can decrease.

Further, the heat-dissipation layer and cushion layer having different functions can be formed of different materials suitable for the functions thereof. In this connection, inter-layer separation or adhesion deterioration between the various layers formed of different materials can occur.

In particular, in order to fix or connect each layer, a separate adhesive layer must be added between the layers. This can lead to an increase in a thickness, and a limitation in selection of a type of the adhesive layer depending on a material to be bonded and an increase in a cost of the device.

Further, because the cushion plate is formed in a multi-layered structure, change in a shape of the cushion plate can be limited.

Moreover, a sudden impact is applied to the display device. In this connection, because an edge portion (or a periphery portion) is generally most vulnerable to the impact, considerable damage can occur at the edge portion (or a periphery portion) of the display device.

The cushion plate disposed on the rear face of the display panel can be disposed close to a frame that houses the display module. In particular, an edge portion of the cushion plate can be disposed very close to an edge portion (or a periphery portion) of the frame.

Therefore, when the sudden impact is applied to the edge portion of the display device, the impact can be directly transmitted to the edge portion of the cushion plate, and then, the impact can be transmitted to the display panel.

Even though the cushion plate has the shock absorbing function, the shock absorbing function of the cushion plate may not work effectively when the sudden shock is applied through the edge (or the periphery) that is vulnerable to the shock.

Further, when moisture invades into the cushion plate, the shock absorbing function of the cushion plate can be deteriorated.

For example, when the display device is used in a very humid environment or falls into water, moisture can invade into an interior of the display device. In this case, when the moisture invades into the cushion layer of the cushion plate, the shock absorption function thereof can be greatly degraded.

Accordingly, the inventors of the present disclosure have invented a display module and a display device which can improve a heat-dissipation performance and a shock absorption function while reducing the bezel area, and in particular, reduce the impact applied to the edge of the cushion plate, and reduce the deterioration in the shock absorption function due to the moisture.

A purpose to be achieved according to an embodiment of the present disclosure is to provide a display module and a display device capable of reducing an impact applied to an edge (or a periphery) of a cushion plate.

A purpose to be achieved according to an embodiment of the present disclosure is to provide a display module and a display device capable of reducing moisture invasion into a cushion plate.

A purpose to be achieved according to an embodiment of the present disclosure is to provide a display module and a display device capable of improving a heat-dissipation performance and a shock absorption function while reducing the bezel area.

A purpose to be achieved according to an embodiment of the present disclosure is to provide a display module and a display device capable of minimizing interlayer separation or adhesion deterioration between layers constituting a cushion plate.

A purpose to be achieved according to an embodiment of the present disclosure is to provide a display module and a display device including a cushion plate have a higher freedom in a shape change thereof.

Purposes to be achieved according to an embodiment of the present disclosure are not limited to the purpose as mentioned above. Other purposes that are not mentioned can be clearly understood by those skilled in the art based on following descriptions.

A display module according to an embodiment of the present disclosure includes a cover member, a display panel disposed on a rear face (or a rear surface) of the cover member, and a cushion plate disposed on a rear face (or a rear surface) of the display panel and including a metal foam and a water-proof layer.

In this case, the metal foam includes a body and a chamfer along an edge (or a periphery) of the body, and the water-proof layer is disposed on a rear face (or a rear surface) of the metal foam, and covers a rear face (or a rear surface) of the body, and the chamfer.

The chamfer is disposed on the rear face of the body, and is formed by removing at least a portion of a rear face (or a rear surface) and at least a portion of a side face (or a side surface) of the metal foam.

The chamfer includes at least one of an inclined face (or an inclined surface), a right angled face (or a right angled surface), and a curved face (or a curved surface), and extends along an entire perimeter of the body.

The water-proof layer includes an organic material, and the water-proof layer additionally covers a side face of the body.

A display device according to an embodiment of the present disclosure includes a cover member, a display module according to an embodiment of the present disclosure coupled to a rear face (or a rear surface) of the cover member, and a frame disposed on a rear face (or a rear surface) of the display module to support the cover member.

In accordance with the present disclosure, the chamfer can be formed along the edge (or the periphery) of the metal foam included in the cushion plate, such that a spacing between an edge (or a periphery) of the cushion plate and the frame can be maximized, and thus the impact applied to the edge of the cushion plate can be reduced as much as possible.

Further, in accordance with the present disclosure, the water-proof layer can cover the rear face (or the rear surface) of the body of the metal foam included in the cushion plate, and the chamfer thereof, thereby minimizing a moisture invading path and thus reducing moisture invasion into the cushion plate as much as possible.

In particular, because the chamfer is formed by removing at least a portion of the rear face (or the rear surface) as well as at least a portion of the side face (or the side surface) of the metal foam, the water-proof layer can cover the side face (or the side surface) of the metal foam, thereby more effectively reducing the moisture invasion into the side face (or the side surface) of the cushion plate.

Further, the cushion plate according to the present disclosure includes the metal foam having both a heat-dissipation function and a cushion function. Thus, the cushion plate can have an effective heat-dissipation function and an effective cushion function at the same time only using the metal foam without a separate heat-dissipation layer or a separate cushion layer.

In particular, the metal foam has a very good heat-dissipation function and a very good cushioning function even when the metal foam is thin. Thus, a total thickness of the cushion plate can be greatly reduced, such that the bezel area can be reduced.

Further, the cushion plate according to the present disclosure can realize both the heat-dissipation function and the cushion function only using the metal foam. Thus, it is not necessary to stack separate layers formed of different materials having a heat-dissipation function and a cushion function, respectively, thereby minimizing the interlayer separation or adhesion deterioration.

In addition, because there is no need to add a separate adhesive layer configured to fix or connect each of layers, an increase in thickness due to the adhesive layer or an increase in a manufacturing cost of the display device due to the addition of various layers may not occur.

Further, because the cushion plate according to the present disclosure includes the metal foam having a higher freedom in the change shape, the shape of the cushion plate can be freely and easily changed in response to a design change of the display module.

Effects of the present disclosure are not limited to the above-mentioned effects, and other effects as not mentioned will be clearly understood by those skilled in the art from following descriptions.

DETAILED DESCRIPTIONS

Figure 1A:
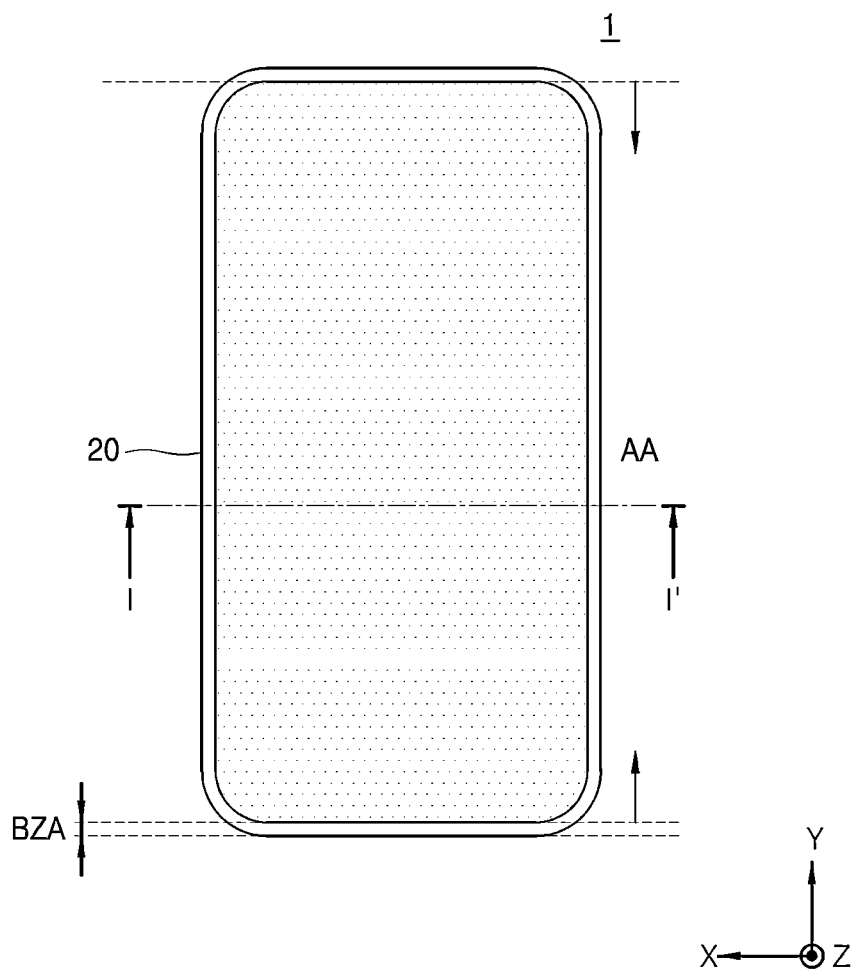
FIGS. 1A and 1B respectively show a front face and a rear face of a display device according to an embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs.

A shape, a size, a ratio, an angle, a number, etc., disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to," or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

In descriptions of temporal relationships, for example, temporal precedent relationships between two events such as "after," "subsequent to," "before," etc., another event can occur therebetween unless "directly after," "directly subsequent" or "directly before" is not indicated.

It will be understood that, although the terms "first," "second," "third," and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Hereinafter, various configurations of a display module and a display device that can improve a heat-dissipation performance and a shock absorption function while reducing a bezel area, and in particular, can reduce an impact applied to an edge (or a periphery) of a cushion plate and reduce deterioration of the shock absorbing function due to moisture will be described in detail.

Figure 1B:
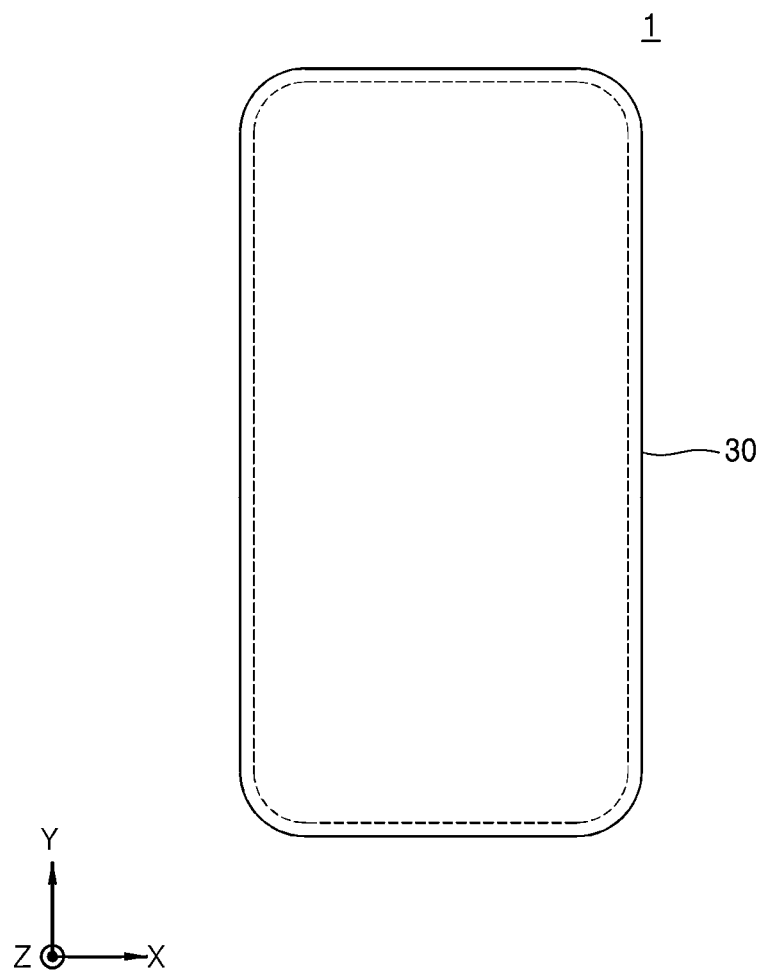

FIG. 1A briefly shows a front face (or a front surface) of a display device 1 on which an image is displayed, and FIG. 1B briefly shows a rear face (or a rear surface) of display device 1.

Figure 2:
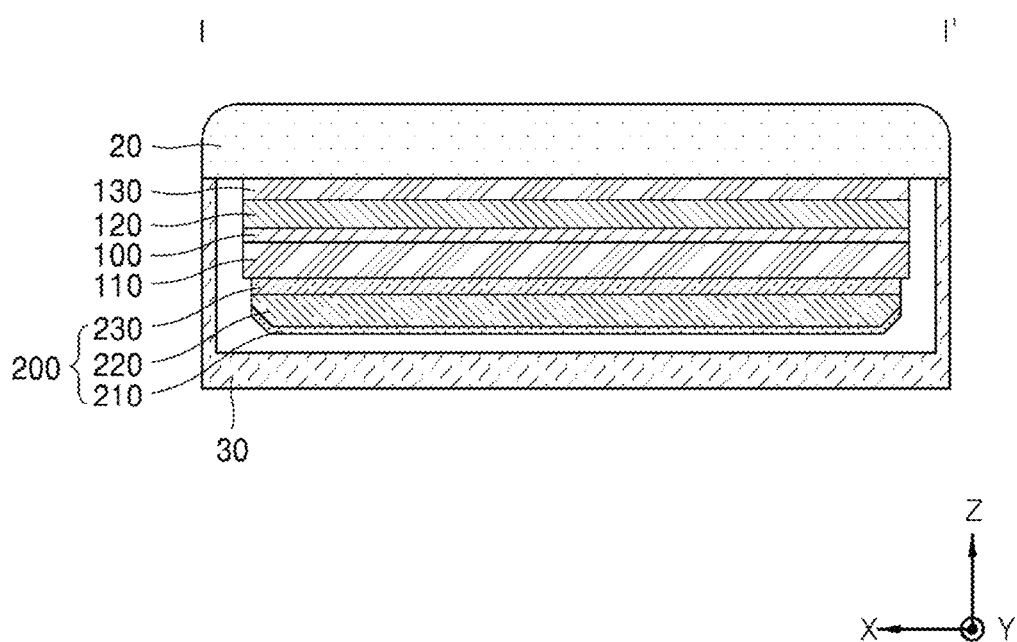
FIG. 2 is a cross-sectional view taken along an I-I' direction of a display module according to an embodiment of the present disclosure.

FIG. 2 is a cross-sectional view taken along an I-I' direction of a display module 10 according to an embodiment of the present disclosure.

The display device 1 includes a cover member 20, a display module 10 coupled to a rear face (or a rear surface) of cover member 20, and a frame 30 disposed on a rear face (or a rear surface) of display module 10 to support the cover member 20.

The display module 10 can include a display panel 100 and include various layers such as a functional film 120, a back plate 110, and a cushion plate 200, and can be bonded or attached to the cover member 20 via a module fixing member (or a connection member) 130.

The cover member 20 can be disposed to cover a front face (or a front surface) of the display module 10, and thus can protect the display module 10 from external shocks.

An edge (or a periphery) of the cover member 20 can have a round shape in which the edge thereof is curved toward a rear face (or a rear surface) thereof on which the display module 10 is disposed.

The display device 1 displays an image through a front face (or a front surface) of the cover member 20, and is configured such that a non-display area NAA is formed around a display area AA.

In other words, the front face (or the front surface) of the cover member 20 can be divided into the display area AA and the non-display area NAA as an area other than the display area AA. The non-display area NAA can be formed along an edge (or a periphery) of the display area AA, and the non-display area NAA can be defined as a bezel area BZA.

The cover member 20 includes the display area AA that displays a screen, and thus can be formed of a transparent material such as a cover glass to display the screen. For example, the cover member 20 can be formed of a transparent plastic material, a glass material, or a reinforced glass material.

The frame 30 can be disposed on the rear face (or the rear surface) of display module 10 and therein accommodate the display module 10 and contact the cover member 20 to support the cover member 20.

The frame 30 serves as a housing that defines a rear face (or a rear surface) of the display device 1, and can be formed of various materials such as plastic, metal, or glass.

In this case, the frame 30 can function as a casing defining an outermost portion of display device 1. However, the present disclosure is not limited thereto.

For example, the frame 30 can function as a middle frame that serves as a housing that protects the rear face (or the rear surface) of display module 10, and there can be an additional casing on the rear face (or the rear surface) of the frame 30.

Hereinafter, the display device 1 and the display module 10 according to an embodiment of the present disclosure will be described in more detail with reference to FIG. 2.

The display module 10 includes the display panel 100 disposed on the rear face (or a rear surface) of cover member 20.

The display module 10 can be defined as including the display panel 100 attached to the rear face (or the rear surface) of cover member 20, and additional components related to the display panel 100 except the cover member 20 in a narrow sense. The display module 10 can be defined as including the cover member 20 in a broad sense.

The display module 10 can additionally include various layers such as the functional film 120, the back plate 110, and the cushion plate 200.

The display module 10 can be bonded or attached to the cover member 20 via the module fixing member (or a connection member) 130.

First, specifically, the module fixing member 130 that fixes or connects the display panel 100 to the cover member 20 is disposed on the rear face (or the rear surface) of the cover member 20.

Since the module fixing member 130 can be disposed to overlap the display area AA, the module fixing member 130 can be embodied as a transparent adhesive member. For example, the module fixing member 130 can be formed of or include a material such as OCA (Optical Clear Adhesive), OCR (Optical Clear Resin), or PSA (Pressure Sensitive Adhesive).

The functional film 120 can be additionally disposed between the module fixing member 130 and the display panel 100. The functional film 120 can have a structure in which one or more functional layers are stacked one on top of another, but is not particularly limited.

In one example, the functional film 120 can include an antireflection layer such as a polarizing film that prevents reflection of external light to improve an outdoor visibility and a contrast ratio for an image displayed on the display panel 100.

In addition, in one example, the functional film 120 can further include a barrier layer for preventing moisture or oxygen invasion. The barrier layer can be formed of a material having low moisture permeability, such as a polymer material.

The display panel 100 can include a display substrate, a pixel array disposed on the display substrate, and an encapsulation portion disposed to cover the pixel array.

The display substrate can serve as a base substrate of the display panel 100. The display substrate can be formed of a flexible plastic material and thus can act as a flexible display substrate.

In one example, the display substrate can be formed of polyimide as a plastic material having flexibility, or can be formed of a thin-type glass material having flexibility.

The pixel array can correspond to an area configured to display the image toward the front face (or the front surface) of the cover member 20, and thus can correspond to the display area AA.

Therefore, the area corresponding to the pixel array in the cover member 20 can be the display area AA, and the area other than the display area AA can be the bezel area.

The pixel array can be implemented using various elements that display an image, and may not be particularly limited.

The pixel array can include a plurality of pixels that are arranged in a pixel area defined by signal lines on the display substrate, and display an image according to signals supplied to the signal lines. The signal lines can include a gate line, a data line, and a pixel driving power line.

Each of the plurality of pixels can include a thin film transistor in the pixel area, an anode electrically connected to the thin film transistor, a light-emissive element layer formed on the anode, and a cathode electrically connected to the light-emissive element layer.

The thin film transistor can include a gate electrode, a semiconductor layer, a source electrode, a drain electrode, and the like. The semiconductor layer of the thin film transistor can include silicon such as a-Si, poly-Si, or low-temperature poly-Si, or an oxide such as IGZO (Indium-Gallium-Zinc-Oxide).

The anode can be disposed in each pixel in a corresponding manner to an opening area defined according to a pattern shape of a pixel, and can be electrically connected to the thin film transistor.

In one example, the light-emissive element layer can include an organic light-emissive element formed on the anode. The organic light-emissive element can be implemented to emit light of the same color such as white light across the pixels or can be implemented to emit light beams of different colors such as red, green, and blue light beams across the pixels.

In another example, the light-emissive element layer can include a micro light-emissive diode element electrically connected to each of the anode and the cathode. The micro light-emissive diode element refers to a light-emissive diode implemented in a form of an integrated circuit (IC) or a chip, and can include a first terminal electrically connected to the anode and a second terminal electrically connected to the cathode.

The cathode can be commonly connected to a light-emissive element of a light-emissive element layer disposed in each pixel area.

The encapsulation portion is formed on the display substrate to cover the pixel array, such that oxygen, moisture, or foreign substances can be prevented from invading into the light-emissive element layer of the pixel array. In one example, the encapsulation portion can be formed in a multilayer structure in which organic material layers and inorganic material layers are alternately stacked one on top of another.

The back plate 110 can be disposed under the display panel 100.

The back plate 110 can be disposed under the display substrate to complement a rigidity of the display substrate, and can be formed to have a certain strength and a certain thickness to complement the rigidity of the display substrate.

The cushion plate 200 can be disposed under the back plate 110.

An embossed layer 230, a metal foam 220 and a water-proof layer 210 of the cushion plate 200 can be sequentially stacked vertically in a direction toward the rear face (or the rear surface) of the display panel 100.

Figure 4:
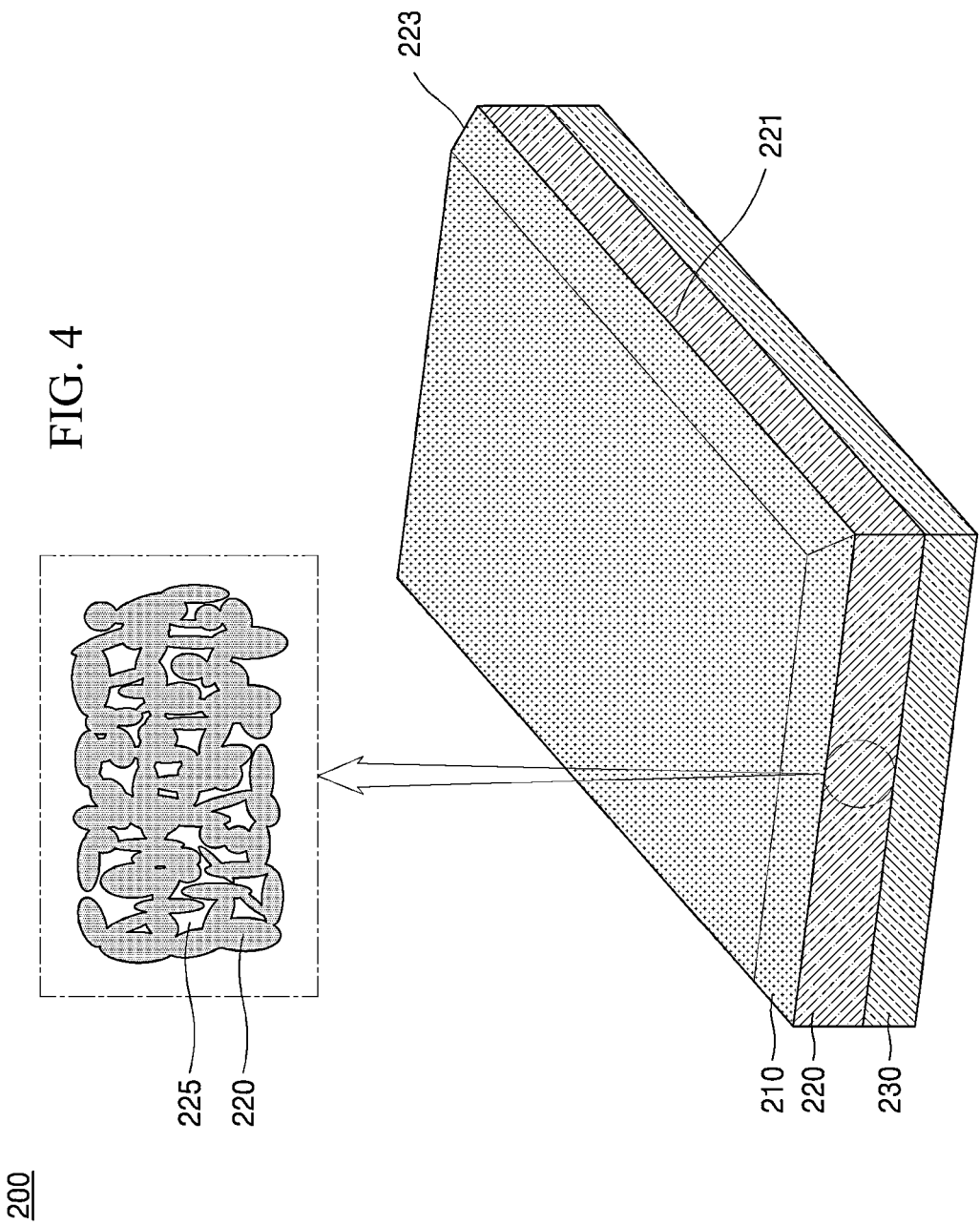
FIG. 4 is a perspective view of a cushion plate according to an embodiment of the present disclosure.

Hereinafter, the cushion plate 200 will be described in detail with reference to FIG. 5A to FIG. 5D showing various embodiments of the cushion plate 200, and FIGS. 6A to 6D showing various embodiments of the metal foam 220, together with FIG. 4 showing a perspective view of the cushion plate 200 according to an embodiment.

The cushion plate 200 includes the embossed layer 230, the metal foam 220 and the water-proof layer 210.

First, the embossed layer 230 can refer to a layer that directly contacts the back plate 110 to fix or connect the cushion plate 200 to the back plate 110, and thus can function as an adhesive layer including an adhesive component.

The embossed layer 230 can be formed of or include a material such as OCA (Optical Clear Adhesive), OCR (Optical Clear Resin), or PSA (Pressure Sensitive Adhesive).

Specifically, the embossed layer 230 can include a base substrate 231, and a first adhesive layer 233a and a second adhesive layer 233b disposed on both opposite faces (or both opposite surfaces) of the base substrate 231, respectively.

In this case, the second adhesive layer 233b can contact the metal foam 220 to bond (or attach) and fix (or connect) the metal foam 220 to the embossed layer 230.

The first adhesive layer 233a of the embossed layer 230 can have a plurality of embossed patterns 233e such as an uneven structure.

The first adhesive layer 233a of the embossed layer 230 can act as a face (or a surface) in contact with the back plate 110. The first adhesive layer 233a has the embossed patterns 233e, thereby preventing production of air bubbles between the back plate 110 and the cushion plate 200, such that a degassing process for removing air bubbles can be omitted.

The base substrate 231 of the embossed layer 230 can serve to hold a shape of the embossed layer 230, and can be formed of a material such as PET.

In order to have an effective anti-bubble effect, the embossed layer 230 preferably has a thickness of at least 40 μm.

The metal foam 220 is disposed on one face (or one surface) of the embossed layer 230.

The metal foam 220 can refer to a porous metal structure including metal as a main component, and the metal foam 220 can have a multiple of pores 225 therein.

That is, the metal foam 220 can refer to a porous metal structure having a multiple of pores 225 therein.

The metal foam 220 can be formed using a following manufacturing method by way of example. However, the present disclosure is not limited thereto.

The metal foam 220 can be formed by sintering a metal foam precursor including metal powders.

The metal foam precursor refers to a structure before proceeding with a process performed to form the metal foam 220 such as the sintering process.

For example, the metal foam precursor can be formed using a slurry including metal powders, dispersant, and binder.

The metal powder can be embodied as mixture metal powers or alloy powders between at least two among copper powder, nickel powder, iron powder, SUS powder, molybdenum powder, silver powder, platinum powder, gold powder, aluminum powder, chromium powder, indium powder, tin powder, magnesium powder, phosphorous powder, zinc powder, and manganese powder. However, the present disclosure is not limited thereto.

In one example, alcohol can be used as the dispersant. However, the present disclosure is not limited thereto.

In this case, the alcohol can include monohydric alcohol having 1 to 20 carbon atoms such as methanol, ethanol, propanol, pentanol, octanol, ethylene glycol, propylene glycol, pentanol, 2-methoxyethanol, 2-ethoxyethanol, 2-butoxyethanol, glycerol, texanol or terpineol, or a dihydric alcohol having 1 to 20 carbon atoms such as ethylene glycol, propylene glycol, hexanediol, octanediol or pentanediol, or polyhydric alcohols other than dihydric alcohol. However, the present disclosure is not limited thereto.

A type of the binder is not particularly limited and can be appropriately adjusted according to a type of a metal component or the dispersant used in preparation of the slurry.

For example, the binder can include an alkyl cellulose having an alkyl group having 1 to 8 carbon atoms such as methyl cellulose or ethyl cellulose, polyalkylene carbonate having an alkylene unit having 1 to 8 carbon atoms such as polypropylene carbonate or polyethylene carbonate, or a polyvinyl alcohol-based binder such as polyvinyl alcohol or polyvinyl acetate. However, the present disclosure is not limited thereto.

After producing the slurry including the metal powder, the dispersant, and the binder as described above, the slurry can be injected into a frame having a predefined shape or coating (or forming) the slurry on the substrate, thereby forming the metal foam precursor.

The metal foam precursor as thus formed can be changed into the metal foam 220 via the sintering process.

In this case, a condition of the sintering process is not particularly limited as long as the process proceeds at a temperature and for a time duration to allow solvent included in the slurry to be removed at a desired amount.

In one example, the sintering temperature can be in a range of about 50° C. to 250° C. and the sintering time duration can be predefined. However, the present disclosure is not limited thereto.

According to an embodiment of the present disclosure, after forming the metal foam precursor on the embossed layer 230, the sintering process can be performed to form the metal foam 220, thereby forming the cushion plate 200 including the embossed layer 230 and the metal foam 220.

Alternatively, after forming the metal foam 220 separately from the embossed layer 230, the embossed layer 230 and the metal foam 220 can be bonded or attached to each other, thereby forming the cushion plate 200 including the embossed layer 230 and the metal foam 220. Thus, the manufacturing method of the cushion plate 200 is not particularly limited.

In the cushion plate 200 including the embossed layer 230 and the metal foam 220, the metal foam 220 as a metal structure having a multiple of pores 225 therein can have a heat-dissipation function and a cushion function at the same time.

The metal foam 220 is formed of metal with a high thermal conductivity, such that the metal foam 220 itself exhibits excellent heat-dissipation function. Since the metal foam has the metal structure having a multiple of pores 225 therein, the metal foam can also realize excellent cushioning function.

In particular, because the metal foam 220 has a metal structure having a multiple of pores 225 therein, an overall surface area thereof can increase, and thus, the metal foam 220 itself can realize the excellent heat-dissipation function.

Therefore, the cushion plate 200 according to an embodiment of the present disclosure has both of an effective heat-dissipation function and an effective cushion functions at the same time using only the metal foam 220 without having a heat-dissipation layer for a heat-dissipation function and a cushion layer for a cushion function as separate layers.

Figure 10A:
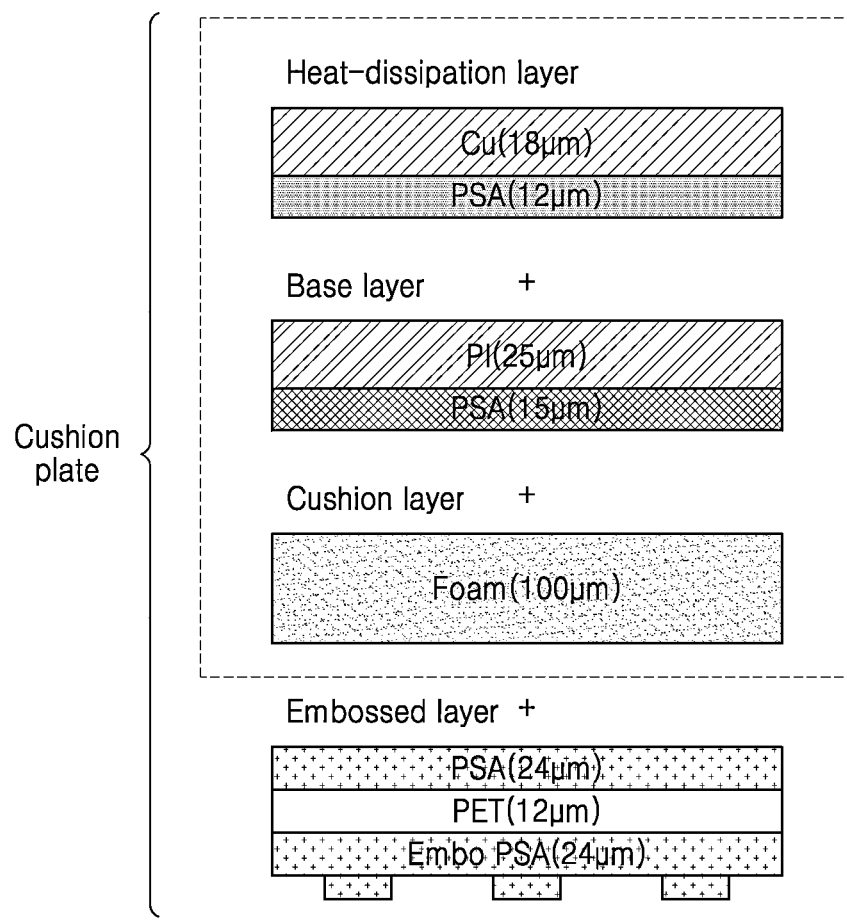
FIG. 10A and FIG. 10B are comparative cross-sectional views of laminated structures of cushion plates according to Comparative Example, and an embodiment of the present disclosure, respectively.
Figure 10B:
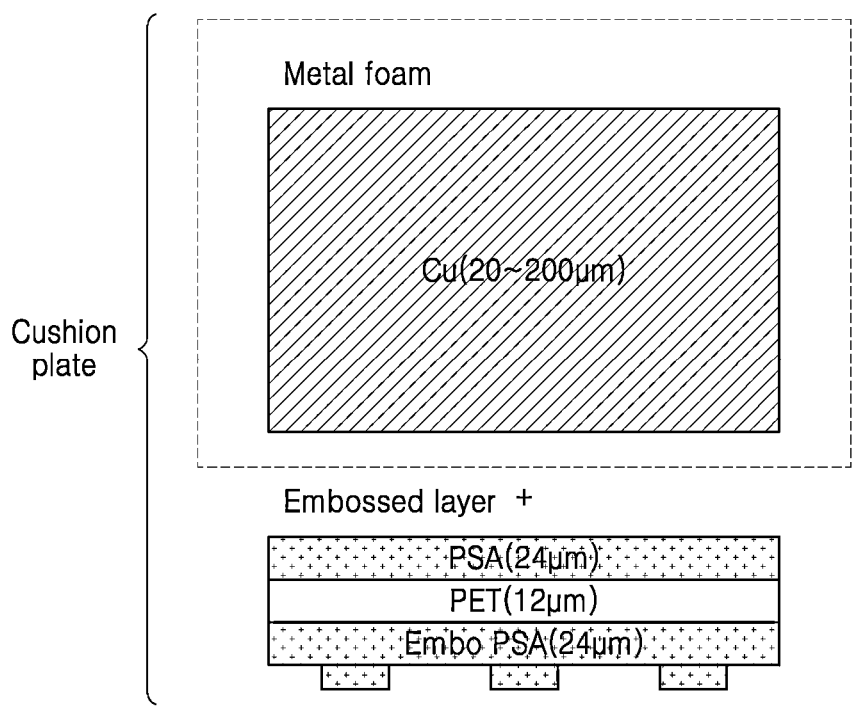

In this regard, referring to FIGS. 10A and 10B, FIG. 10A shows Comparative Example of a cushion plate 200 having a four-layers laminated structure. FIG. 10B shows a cross-sectional view of a cushion plate 200 having a two-layers laminated structure including the metal foam 220 according to an embodiment of the present disclosure.

As shown in FIG. 10A, the cushion plate according to Comparative Example has a structure in which four layers are laminated by sequentially stacking a cushion layer, a base layer, and a heat-dissipation layer on an embossed layer.

The embossed layer can include a base substrate formed of PET, and a first adhesive layer PSA and a second adhesive layer PSA on both opposing faces (or both opposing surfaces) of the base substrate, respectively, wherein the second adhesive layer can be embodied as an embossed adhesive layer Embo PSA.

In this case, the base substrate of the embossed layer can have a thickness of about 12 μm, and each of the first adhesive layer and the second adhesive layer can have a thickness of about 24 μm.

A cushion layer as a foam pad can be formed on the embossed layer to impart a cushion function to the cushion plate.

In this case, the cushion layer should have a thickness of at least 100 μm in order to provide minimum effective cushioning function using only the foam pad.

The heat-dissipation layer is formed on the cushion layer, and the base layer must be added between the cushion layer and the heat-dissipation layer.

The heat-dissipation layer is directly bonded or attached to the cushion layer. In this case, when the cushion plate is bent in a bent area of the display module 10 and then a time lapses, the cushion layer and the heat-dissipation layer formed of different materials from each other are not completely adhered to each other, and are separated from each other.

Accordingly, the base layer can be added between the cushion layer and the heat-dissipation layer to minimize the separation between the cushion layer and the heat-dissipation layer and to realize flexibility in the bent area.

The base layer can be formed by disposing an adhesive layer PSA on a flexible base formed of polyimide (PI).

In this case, in order for the base layer to achieve minimum effective separation-suppressing and support functions, the base formed of the polyimide should have a thickness of at least 25 μm, and a thickness of the adhesive layer PSA included in the base layer should be at least 15 μm.

The heat-dissipation layer is disposed on the base layer to impart a heat-dissipation function to the cushion plate.

The heat-dissipation layer can be formed by disposing an adhesive layer PSA on a metal layer formed of a material having good thermal conductivity such as copper.

In this case, in order for the heat-dissipation layer to achieve minimum effective heat-dissipation function, the metal layer must have a thickness of at least 18 μm, and a thickness of the adhesive layer PSA included in the heat-dissipation layer should be at least 12 μm.

In other words, the cushion plate according to Comparative Example can have a structure in which the four layers are laminated, that is, the layers having separate functions must be stacked one on top of another in order to provide both of the heat-dissipation function and the cushion function. Thus, the number of process steps can increase, thus leading to an increase in a manufacturing cost of the display device.

In particular, the layers having different functions are formed of different materials. Thus, additional adhesive layers must be disposed between the layers in order to bond or attach the layers to each other. Thus, a total thickness of the cushion plate can be further increased.

To the contrary, as shown in FIG. 10B, the cushion plate 200 according to an embodiment of the present disclosure can achieve both of an effective heat-dissipation function and an effective cushion function only using a double-layer laminated structure in which the metal foam 220 and the embossed layer 230 are stacked one on top of the other.

That is, because the cushion plate 200 according to an embodiment of the present disclosure can realize both the heat-dissipation function and the cushion function using only the metal foam 220, there is no need to stack separate layers formed of different materials having a heat-dissipation function and a cushion function, respectively, so that separation between the layers, and adhesion deterioration therebetween can be minimized.

In addition, there is no need to add a separate adhesive layer configured to fix or connect the layers to each other. Thus, the increase in the manufacturing cost of the display device due to the increase in the thickness due to the adhesive layer or the addition of various layers may not occur.

In this case, a thickness of the metal foam 220 can be in a range of 20 μm to 200 μm, and a thickness of the cushion plate 200 can be in a range of 80 μm to 260 μm.

In particular, even when the metal foam 220 of the cushion plate 200 according to an embodiment of the present disclosure has a minimum thickness of 20 μm, the metal foam 220 can have both a heat-dissipation function and a cushion function. Thus, a total thickness of the cushion plate 200 can be reduced.

The minimum and maximum thicknesses of each of the metal foam 220 and the cushion plate 200 can be appropriately adjusted according to a shape change of the display module 10.

As described above, the cushion plate 200 according to an embodiment of the present disclosure includes the metal foam 220 having a higher freedom in the shape change.

Thus, in response to the design change of the display module 10, the shape of the cushion plate 200 can be freely and easily changed.

The embossed layer 230 is disposed on one face (or one surface) of the metal foam 220, and the water-proof layer 210 is disposed on the opposite face (or the opposite surface) of the metal foam 220.

In other words, the embossed layer 230 and the water-proof layer 210 are opposite to each other around the metal foam 220.

The metal foam 220 having the higher freedom in the shape change includes a body 221 and a chamfer 223 along an edge (or a periphery) of the body 221.

The chamfer 223 is formed on an opposite face (or an opposite surface) of the metal foam 220 where the water-proof layer 210 is disposed, and is not formed on one face (or one surface) of the metal foam 220 where the embossed layer 230 is disposed.

When describing based on FIGS. 5A to 5D, one face (or one surface) of the metal foam 220 can be defined as a top face (or a top surface or an upper surface) of the metal foam 220, and the opposite face of the metal foam 220 can be defined as a bottom face (or a bottom surface or a lower surface) of the metal foam 220.

Further, one face (or one surface) and the opposite face (or the opposite surface) thereto of the metal foam 220 can connect to a side face (or a side surface) of the metal foam 220.

Therefore, the water-proof layer 210 can be disposed on the opposite face (or the opposite surface) of the metal foam 220 to cover the opposite face (or the opposite surface) of the body 221 where the chamfer 223 is formed, and the chamfer 223.

In this case, the chamfer 223 of the metal foam 220 can be formed along an entire edge (or an entire periphery) of the body 221.

Figure 5A:
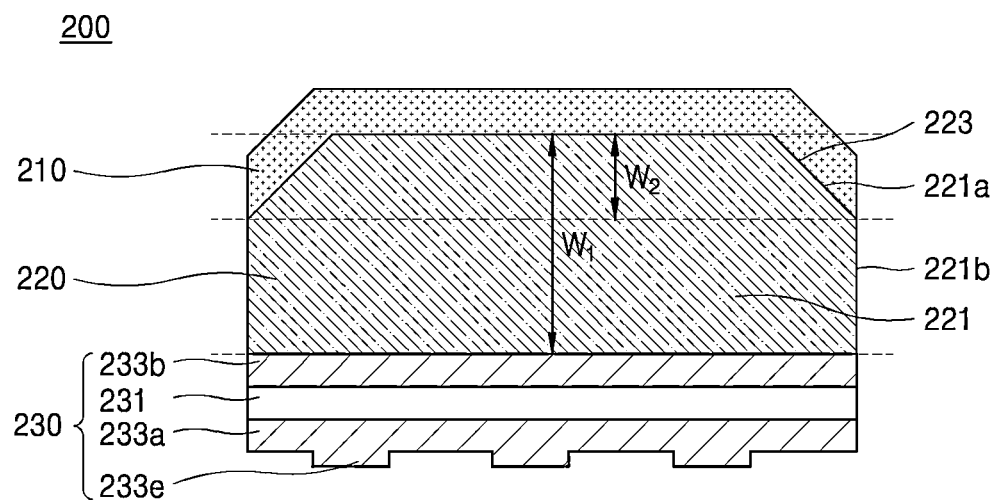
FIGS. 5A to 5D are cross-sectional views of cushion plates according to various embodiments of the present disclosure, respectively.
Figure 5B:
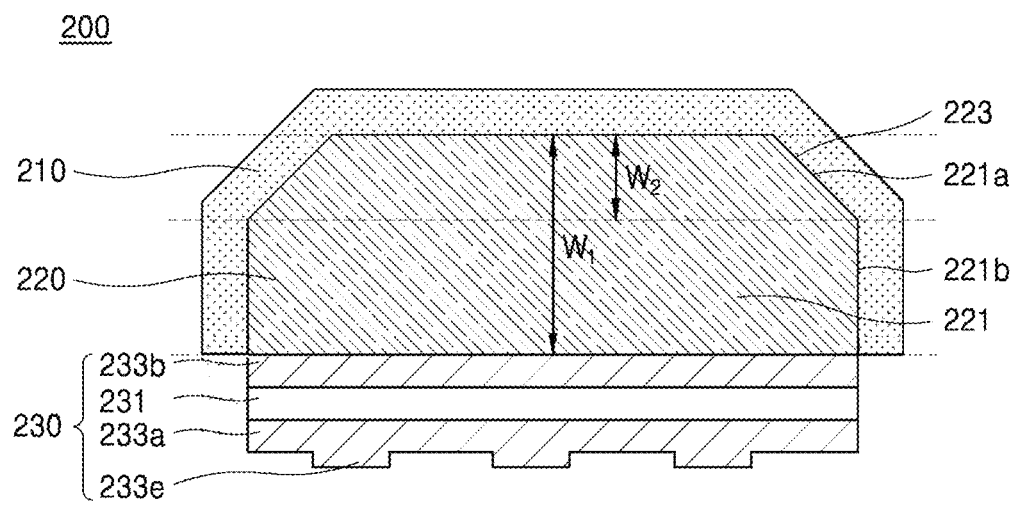

In one example, the chamfer 223 can be formed by removing a portion of an edge area (or a periphery area) of the body 221 so as to have an inclined face (or an inclined surface) as shown in FIG. 5A and FIG. 5B.

Specifically, at least a portion of a top face (or a top surface or an upper surface) and at least a portion of a side face (or a side surface) of the body 221 can be removed. A partial area of the body 221 can be removed so that the removed outer face (or outer surface) of the body 221 is inclined.

Accordingly, the side face (or the side surface) of the body 221 can be divided into a first side face (or a first side surface) 221a formed as an inclined face (or an inclined surface) of the chamfer 223, and a second side face (or a second side surface) 221b free of the chamfer 223.

The water-proof layer 210 disposed on one face (or one surface) of the body 221 can cover one face (or one surface) of the body 221 and the inclined face (or the inclined surface) of the chamfer 223.

In other words, the water-proof layer 210 can cover the top face (or the top surface or the upper surface) of the body 221 and the first side face (or the first side surface) 221a of the body 221 as shown in FIG. 5A.

The water-proof layer 210 can include an organic material.

In general, the organic material has a high waterproof effect.

The organic material can include an acrylic organic material or a polyurethane-based organic material, but is not limited thereto. The organic material can include other organic material components.

Therefore, the water-proof layer 210 can be formed by depositing the organic material on one face (or one surface) of the metal foam 220.

However, when the water-proof layer 210 includes the organic material, it can be difficult to form the water-proof layer 210 so as to cover a right angled side face (or a right angled side surface) such as the second side face (or the second side surface) 221b in terms of a process.

However, because the first side face (or the first side surface) 221a of the body 221 is inclined, the water-proof layer 210 can cover the first side face (or the first side surface) 221a of the body 221 in terms of the process regardless of a type of a material of the water-proof layer 210.

Accordingly, the water-proof layer 210 covering one face (or one surface) of the body 221 and the chamfer 223 can cover the top face (or the top surface or the upper surface) of the body 221 and a portion of the side face (or the side surface) of the body 221.

Further, the water-proof layer 210 can cover the top face (or the top surface or the upper surface) of the body 221 and the first side face (or the first side surface) 221a and the second side face (or the second side surface) 221b of the body 221 as shown in FIG. 5B.

In other words, the water-proof layer 210 can be formed to cover the top face (or the top surface or the upper surface) of the body 221 and an entire side face (or an entire side surface) of the body 221.

In this case, the water-proof layer 210 can include a material which can allow the process to easily form the water-proof layer 210 to cover the right angled side face (or the right angled side surface) such as the second side face (or the second side surface) 221b.

Accordingly, the water-proof layer 210 covering one face (or one surface) of the body 221 and the chamfer 223 thereof can cover the top face (or the top surface or the upper surface) of the body 221 and the entire side face (or the entire side surface) of the body 221.

A thickness $W_2$ of the chamfer 223 can be ⅔ or smaller of a thickness $W_1$ of the body 221.

The metal foam 220 has a shock absorbing function to absorb external shocks. Thus, when a size of the body 221 is greatly reduced, the shock absorbing function can be reduced accordingly.

Therefore, when the thickness $W_2$ of the chamfer 223 formed by removing the edge portion (or the periphery portion) of the body 221 increases, overall shock absorbing function of the metal foam 220 can be reduced. Thus, when the thickness $W_2$ of the chamfer 223 is smaller than or equal to ⅔ of the thickness $W_1$ of the body 221, the deterioration in the shock absorbing function of the metal foam 220 can be minimized.

Figure 5C:
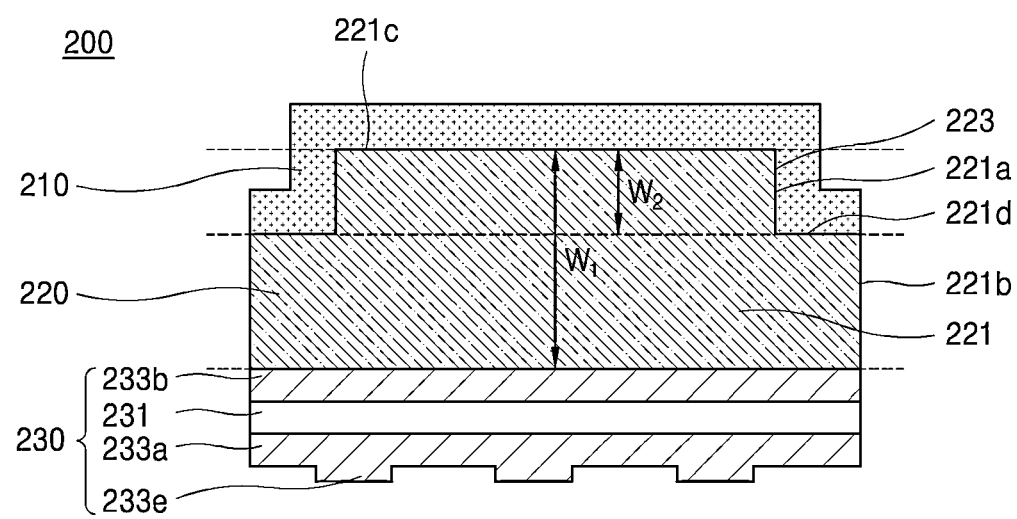

Further, in another example, the chamfer 223 can be obtained by removing a portion of the edge area (or the periphery area) of the body 221 so as to have a right angled face (or the right angled surface) as shown FIG. 5C.

Specifically, at least a portion of the top face and at least a portion of the side face (or the side surface) of the body 221 can be removed. In this connection, a partial area of the body 221 can be removed to have a right angled face.

In this case, the edge (or the periphery) of the body 221 can have a step due to the chamfer 223 having the right angled face.

Accordingly, the top face of the body 221 can include a first top face 221c on which the chamfer 223 is not formed, and a second top face 221d defining a horizontal face of the chamfer 223.

Further, the side face of the body 221 can be divided into the first side face 221a defining a right angled face of the chamfer 223 and the second side face 221b free of the chamfer 223.

The first top face 221c of the body 221 can be connected to the first side face 221a thereof, the first side face 221a thereof can be connected to the second top face 221d thereof, and the second top face 221d thereof can be connected to the second side face 221b thereof.

The water-proof layer 210 disposed on one face of the body 221 can cover one face of the body 221 and the right angled face of the chamfer 223.

In other words, the water-proof layer 210 can cover the top face of the body 221 including the first top face 221c and the second top face 221d of the body 221 and the first side face 221a of the body 221 as shown in FIG. 5C.

In FIG. 5C, unlike the second side face 221b, the first side face 221a constitutes the side face of the step connecting to the second top face 221d. Thus, even when the metal foam 220 is covered with the water-proof layer 210 formed of the organic material, the water-proof layer 210 can cover both the top face of the body 221 and the chamfer 223 without any difficulties in the process.

Figure 5D:
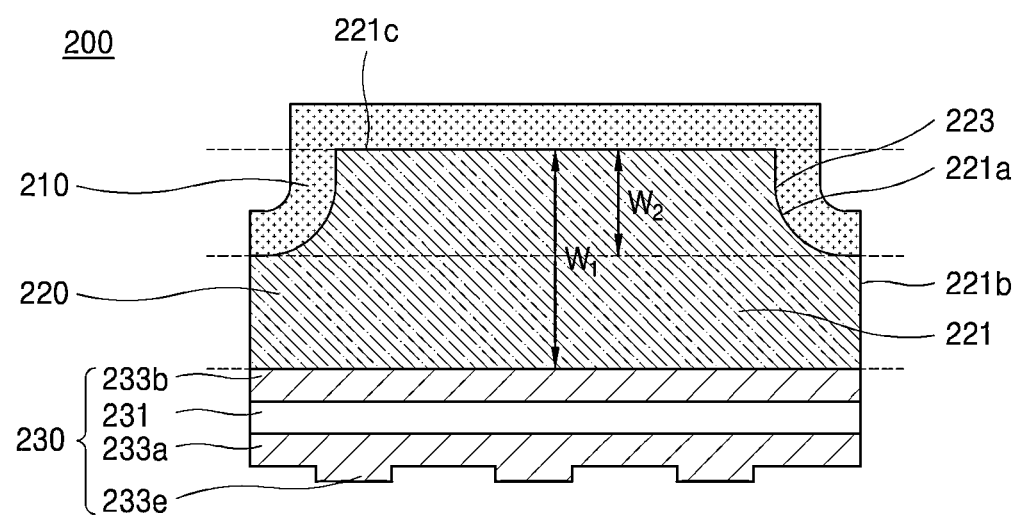

Further, in another example, the chamfer 223 can be obtained by removing a portion of the edge area (or the periphery area) of the body 221 so as to have a curved face as shown in FIG. 5D.

Specifically, at least a portion of the top face and at least a portion of the side face of the body 221 can be removed. In this connection, a partial area of the body 221 can be removed to have a curved face.

Accordingly, the side face of the body 221 can be divided into the first side face 221a as the curved face of the chamfer 223 and the second side face 221b free of the chamfer 223.

In this case, the curved face can be formed to have a concave shape, and can have a shape approximate to a step shape.

The water-proof layer 210 disposed on one face of the body 221 can cover one face of body 221 and the curved face of the chamfer 223.

That is, the water-proof layer 210 can cover the top face of the body 221 and the first side face 221a of the body 221 as shown in FIG. 5D.

In FIG. 5D, unlike the second side face 221b, the first side face 221a defines the curved side face having a shape approximate to a step shape. Even when the metal foam 220 is covered with the water-proof layer 210 including the organic material, the water-proof layer 210 can cover both the top face of the body 221 and the chamfer 223 without any difficulties in the process.

As shown in FIG. 2, each of the cushion plates 200 having the stacked structures according to various embodiments is disposed on the rear face of the display panel 100 when being applied to the display module 10 of the display device 1. In this connection, the embossed layer 230, the metal foam 220 and the water-proof layer 210 of the cushion plate 200 are stacked in this order in a direction toward the rear face of the display panel 100.

The front face of the metal foam 220 of the cushion plate 200 contacts the embossed layer 230, while the rear face of the metal foam 220 thereof contacts the water-proof layer 210.

Therefore, the chamfer 223 obtained by removing at least a portion of the rear face and at least a portion of the side face of the metal foam 220 along the edge (or the periphery) of the metal foam 220 is disposed on the rear face of the body 221.

The water-proof layer 210 is disposed on the rear face of the metal foam 220 to cover the rear face of the body 221 and the chamfer 223.

Because the water-proof layer 210 is disposed to cover the chamfer 223 obtained by removing at least a portion of the rear face and at least a portion of the side face of the metal foam 220, the water-proof layer 210 can cover the rear face of the metal foam 220 free of the chamfer 223 and at least a portion of the side face of the metal foam 220 having the chamfer 223.

The display module 10 as described above is coupled to the rear face of the cover member 20, and the frame 30 is disposed on the display module 10 to support the cover member 20.

Figure 3A:
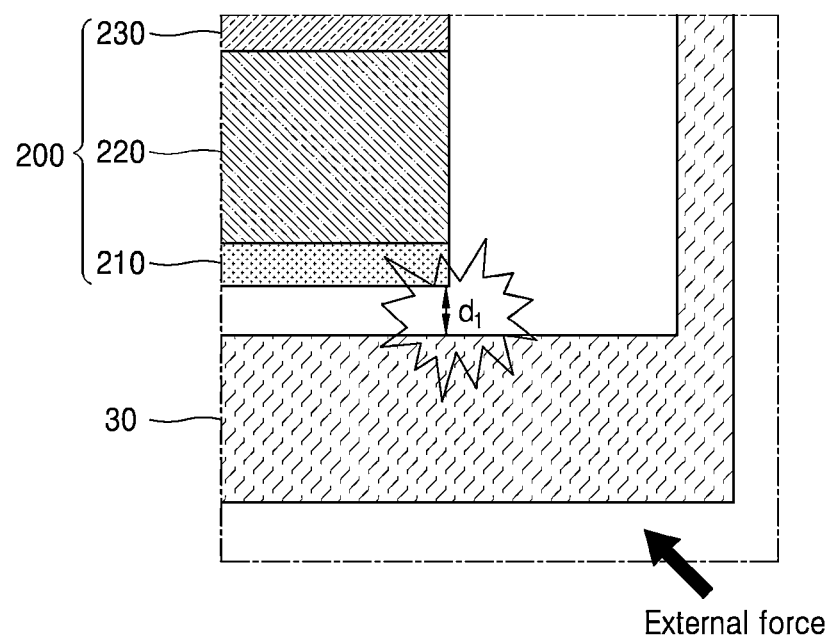
FIG. 3A and FIG. 3B are enlarged cross-sectional views when an external force is applied to edges (or peripheries) of display device according to Comparative Example, and an embodiment of the present disclosure, respectively.
Figure 3B:
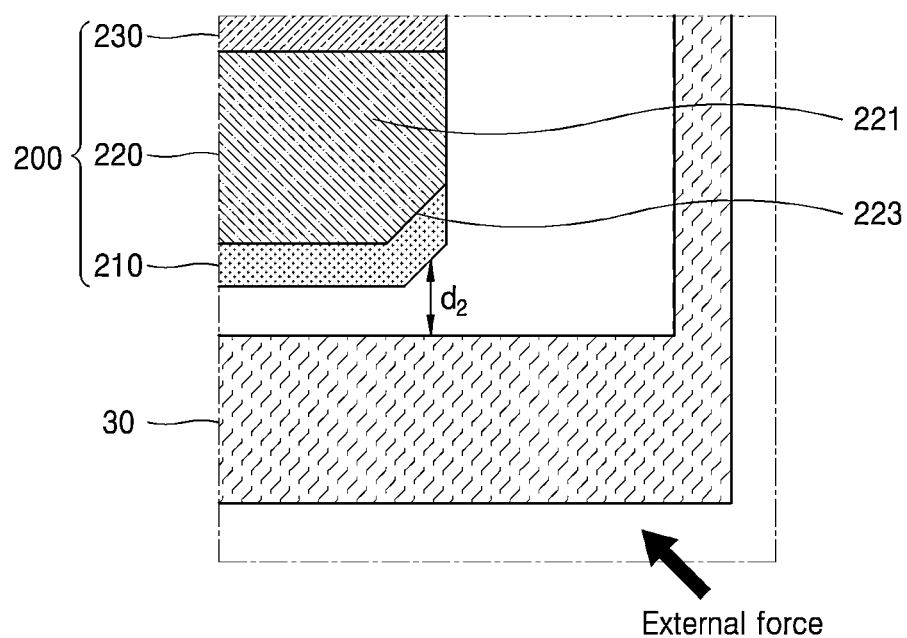

FIGS. 3A and 3B are enlarged cross-sectional views when an external force is applied to an edge (or a periphery) of a display device according to Comparative Example and an edge (or a periphery) of the display device 1 according to the embodiment, respectively.

Comparative Example according to FIG. 3A has the same stack structure as that of the embodiment according to FIG. 3B in that the cushion plate 200 is formed by sequentially stacking the embossed layer 230, the metal foam 220, and the water-proof layer 210 in a direction toward the rear face of the display panel 100.

However, Comparative Example shown in FIG. 3A differs from the embodiment shown in FIG. 3B in that the chamfer 223 is formed along the edge (or the periphery) of the metal foam 220 in FIG. 3B while the chamfer 223 is not formed along the edge (or the periphery) of the metal foam 220 in FIG. 3A.

The edge portion (or the periphery portion) of the display device 1 is most vulnerable to an impact resulting from the external force.

Therefore, when a sudden impact is applied to the display device 1, the edge portion (or the periphery portion) is most vulnerable to the impact, such that considerable damage occurs at the edge portion (or the periphery portion) of the display device 1.

When an external force is applied to the display device 1, the impact can be first applied to the frame 30 which constitutes an exterior appearance of the display device 1.

When the impact applied to the frame 30 is transmitted to the internal display panel 100, the display panel 100 can be damaged by the external force or by the impact.

In this case, as shown in FIG. 3A, the cushion plate 200 disposed on the rear face of the display panel 100 is disposed closer to the frame 30 that houses the display module 10. In particular, an edge portion (or a periphery portion) of the cushion plate 200 is very closer to an edge portion (or a periphery portion) of the frame 30.

Therefore, when a sudden impact is applied to the edge portion (or the periphery portion) of the display device 1, the impact can be directly transmitted to the edge portion (or the periphery portion) of the cushion plate 200, and then, the impact can be transmitted to the display panel 100.

When a spacing $d_1$ between the edge (or the periphery) of the cushion plate 200 and the frame 30 is as large as possible so that the impact applied to the frame 30 is not transmitted to the edge of the cushion plate 200, the total thickness of the display device 1 increases.

On the contrary, in the embodiment of the present disclosure as shown in FIG. 3B, the chamfer 223 is formed along the edge (or the periphery) of the metal foam 220 included in the cushion plate 200, such that a spacing $d_2$ between the edge of the cushion plate 200 and the frame 30 is maximized.

In particular, the spacing $d_2$ between the edge of the cushion plate 200 most vulnerable to the impact and the frame 30 can be maximized without changing a general spacing between the cushion plate 200 and the frame 30.

Therefore, according to an embodiment of the present disclosure, the impact applied to the edge of the cushion plate 200 can be reduced as much as possible without increasing the total thickness of the display device 1.

On the other hand, in Comparative Example shown in FIG. 3A, there is no change in the shape of the metal foam 220, so that the water-proof layer 210 does not cover the side face of the metal foam 220 but covers the rear face of the metal foam 220.

In contrast, in the embodiment shown in FIG. 3B, the chamfer 223 is formed along the edge (or the periphery) of the metal foam 220, such that the water-proof layer 210 is disposed to cover the rear face and at least a portion of the side face of the metal foam 220.

This will be described in detail with referring to FIGS. 7 to 9.

Figure 7A:
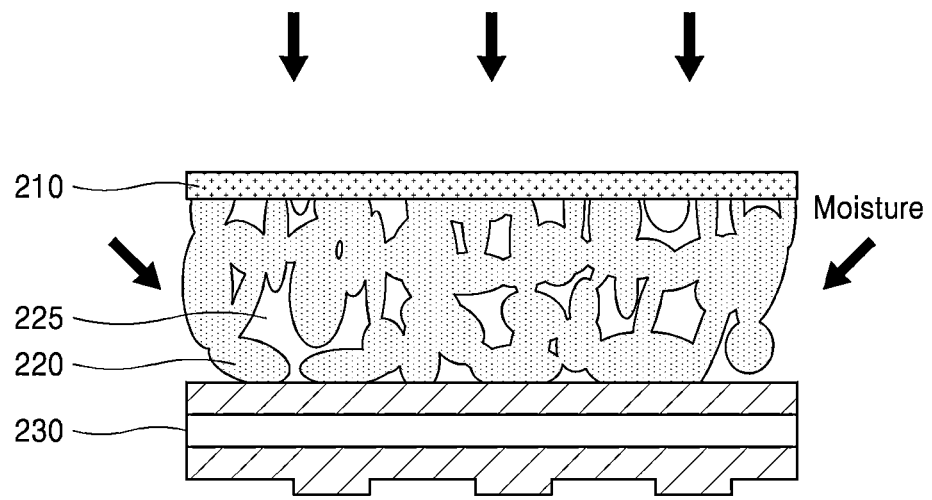
FIG. 7A and FIG. 7B are cross-sectional views showing waterproofing effects of cushion plates according to Comparative Example, and an embodiment of the present disclosure, respectively.
Figure 8A:
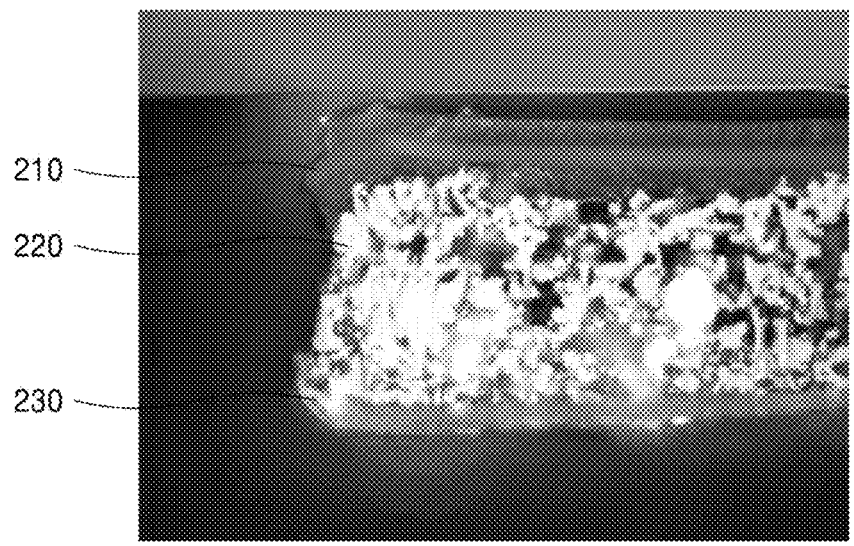
FIG. 8A and FIG. 8B are SEM photographs of cross sections of cushion plates according to Comparative Example, and an embodiment of the present disclosure, respectively.

FIG. 7A and FIG. 8A show a cross-sectional view and a scanning electron microscope (SEM) photograph of the cushion plate 200 according to Comparative Example, respectively.

Figure 7B:
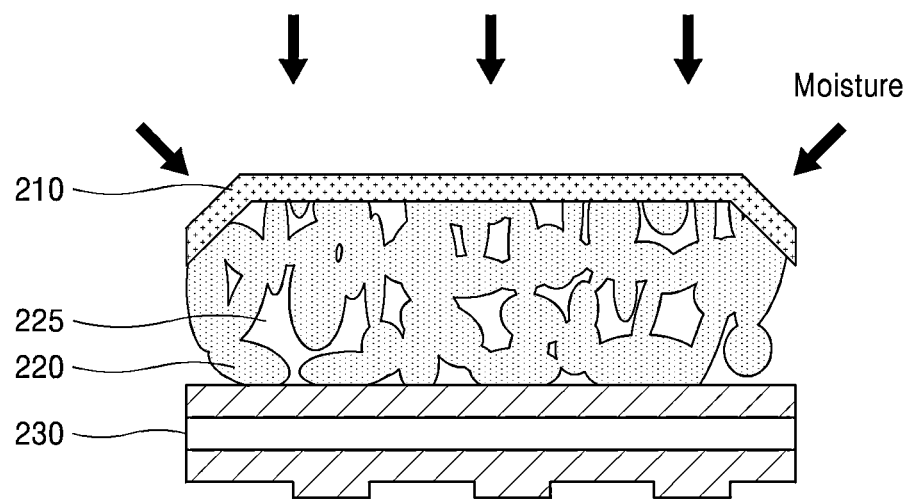
Figure 8B:
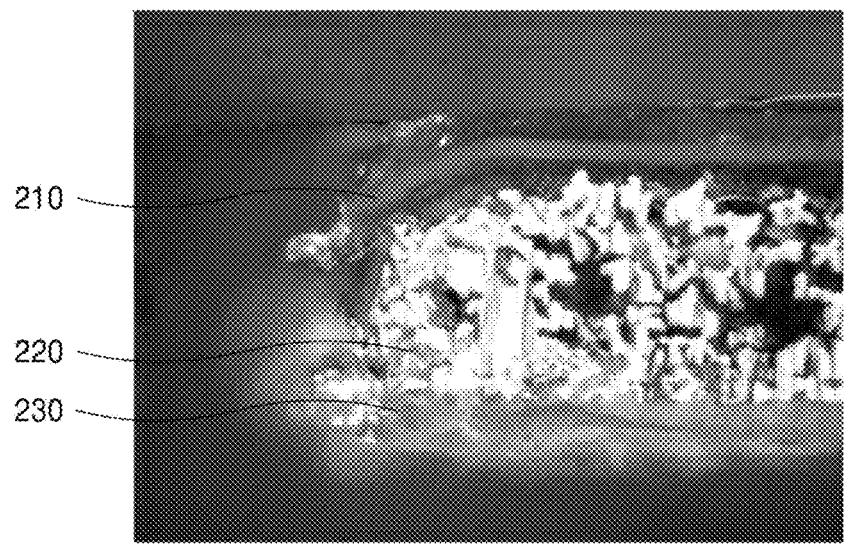

FIG. 7B and FIG. 8B show a cross-sectional view and a SEM photograph of the cushion plate 200 according to the embodiment of the present disclosure, respectively.

Figure 9A:
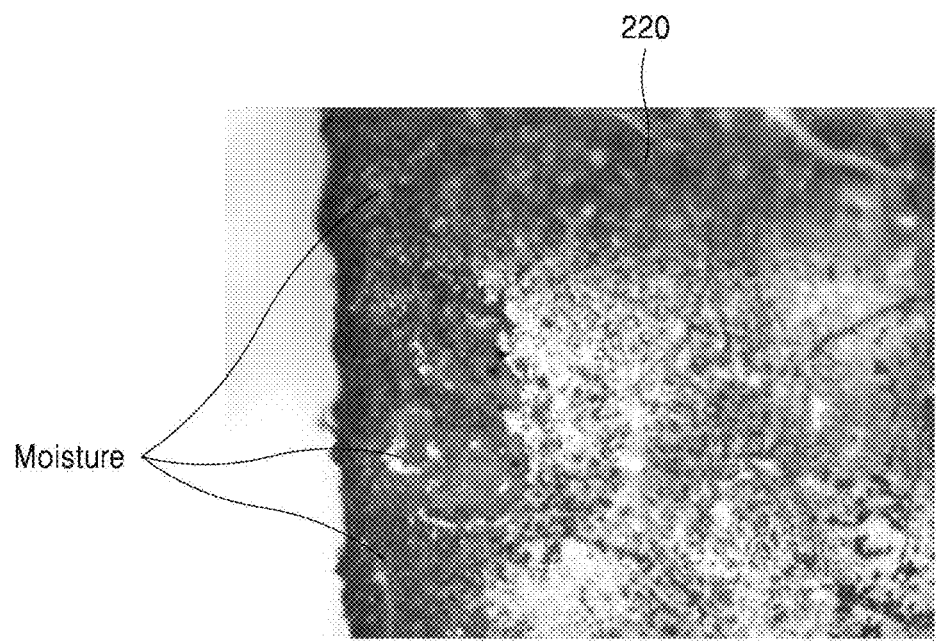
FIG. 9A and FIG. 9B are SEM photographs showing moisture invasion into cushion plates according to Comparative Example, and an embodiment of the present disclosure, respectively.
Figure 9B:
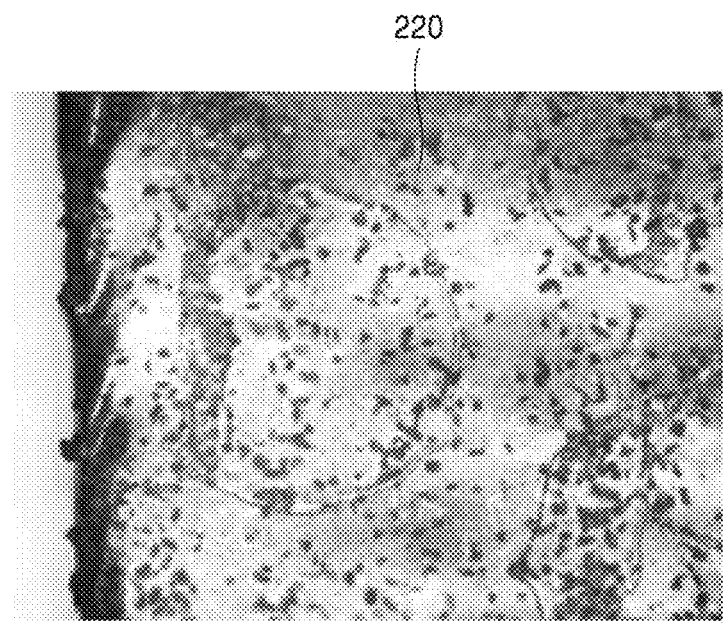

FIGS. 9A and 9B are SEM photographs identifying whether moisture invades into the pores 225 of the metal foam 220 after exposing the cushion plates 200 according to Comparative Example and according to the embodiment of the present disclosure to the same moisture environment, respectively.

As shown in FIG. 7A, in the Comparative Example, the water-proof layer 210 covers the top face of the metal foam 220 but does not cover the side face of the metal foam, the moisture may not invade into the metal foam 220 through the top face thereof but can invade into the metal foam 220 through the side face thereof.

In this case, because the metal foam 220 has a porous metal structure including a multiple of pores 225, the moisture can invade into the multiple of pores 225.

In this regard, referring to FIG. 9A, it can be identified that a large amount of moisture has invaded into the pores 225 of the metal foam 220 according to the Comparative Example.

The cushion plate 200 includes the metal foam 220 including a multiple of pores 225, and can have a shock absorbing function that absorbs external shocks while a porosity thereof is maintained at a level above a certain level.

However, when the porosity of the metal foam 220 is reduced due to the invasion of the external moisture into the pores 225 of the metal foam 220, the shock absorption function of the cushion plate 200 is greatly reduced.

Therefore, the cushion plate 200 having the same structure as in Comparative Example may not prevent the moisture from invasion into the side face of the metal foam 220, such that the shock absorbing function of the cushion plate 200 decreases due to the moisture invasion.

On the contrary, as shown in FIG. 7B, in the embodiment of the present disclosure, the water-proof layer 210 is disposed to cover not only the top face of the metal foam 220, but also at least a portion of the side face thereof, thereby effectively preventing the moisture from invading not only into the top face but also the side face of the metal foam 220.

In this regard, referring to FIG. 9B, it can be identified that the moisture may not invade into the pores 225 of the metal foam 220 according to the embodiment.

That is, according to the embodiment of the present disclosure, when covering the rear face of the body 221 of the metal foam 220 included in the cushion plate 200 and the chamfer 223 of the metal foam 220 with the water-proof layer 210, the moisture can invade into the cushion plate 200 at a minimum level.

In particular, because the chamfer 223 is formed by removing at least a portion of the rear face of the metal foam 220 as well as at least a portion of the side face of the metal foam, the water-proof layer 210 can cover the side face of the metal foam 220, such that the moisture invasion into the side face of the cushion plate 200 can be more effectively reduced.

Figure 6A:
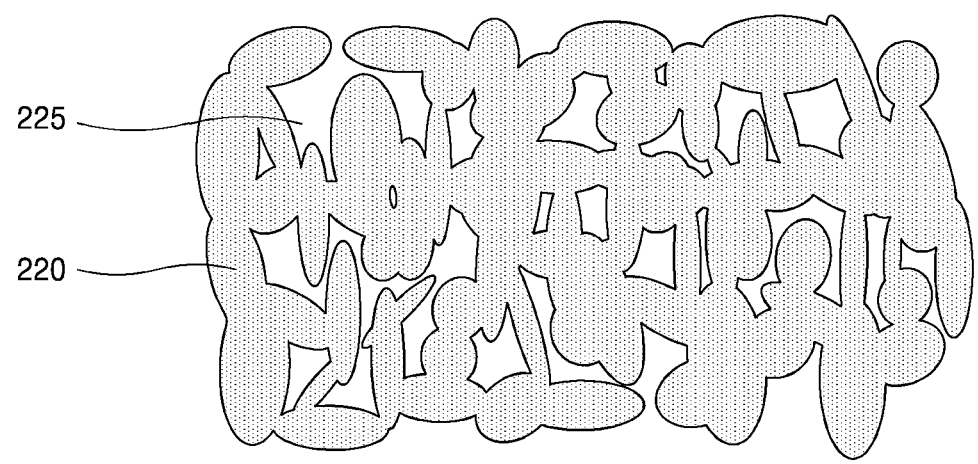
FIGS. 6A to 6C are cross-sectional views of metal foams according to various embodiments of the present disclosure, respectively.
Figure 6B:
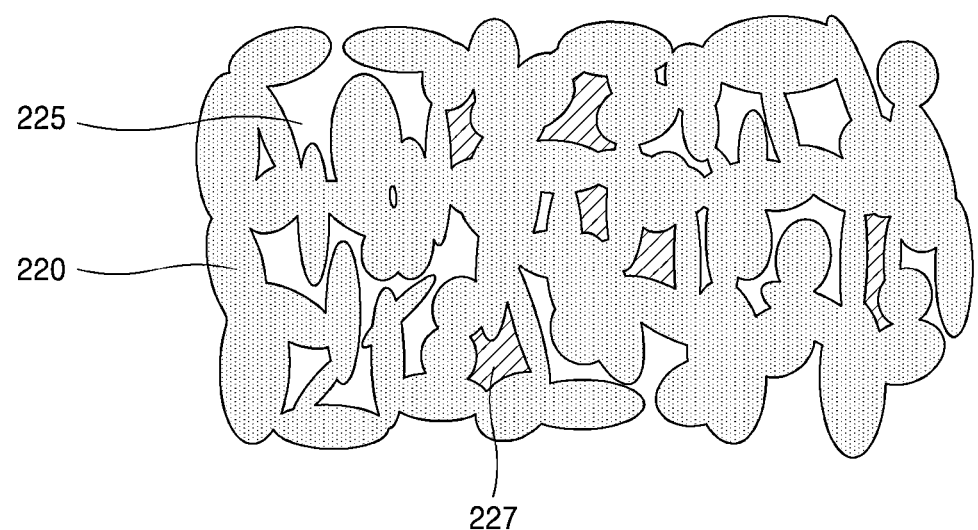
Figure 6C:
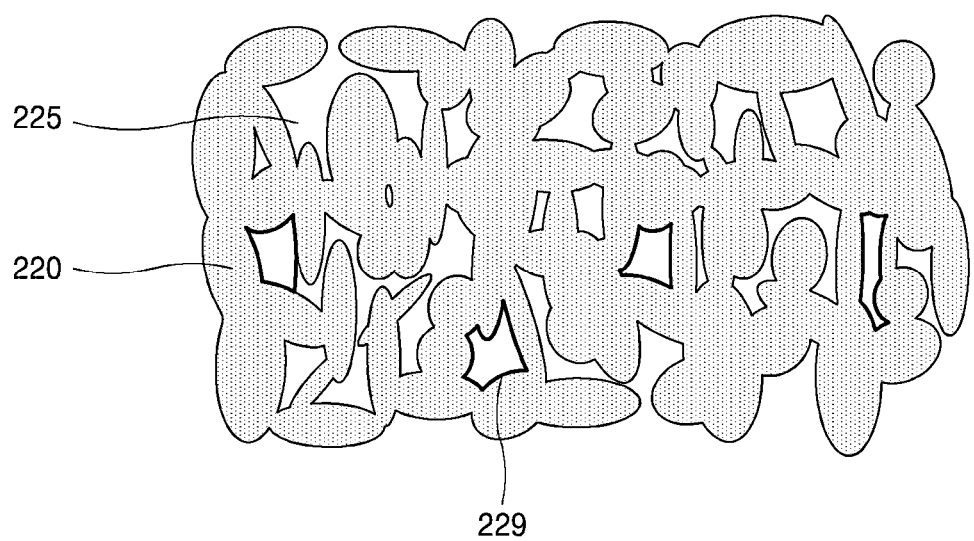

In one example, FIGS. 6A to 6C show metal foams 220 according to various embodiments of the present disclosure, respectively.

As described above, the metal foam 220 according to FIG. 6A has a porous metal structure including a multiple of pores 225 therein.

In this case, the metal foam 220 can have a shock absorbing function due to the pores 225 included in the metal foam 220. Thus, it is desirable to maintain a porosity in a range above a certain value in order to maintain the impact absorption function of the metal foam 220 effectively.

In one example, the metal foam 220 according to FIG. 6B shows another embodiment in which a heat-dissipation material 227 is included in some of the pores 225.

When the metal foam 220 includes a multiple of pores 225, a density of a metal component decreases accordingly. Thus, the shock absorption function can increase, but the heat-dissipation function can decrease to some extent.

Accordingly, the metal foam 220 according to another embodiment of FIG. 6B can further include the heat-dissipation material 227 included in some of the inner pores 225.

In one example, the heat-dissipation material 227 can include a mixture of ceramic powders, or a separate cooling material. However, the present disclosure is not limited thereto.

The ceramic powder can include at least one among boron nitride (BN), aluminum oxide ($Al_2O_3$), silicon carbide (SiC), magnesium oxide (MgO), aluminum hydroxide (Al(OH)$_3$), and magnesium hydroxide (Mg(OH)$_2$). However, the present disclosure is not limited thereto.

The cooling material can include a gel-type silicone resin. However, the present disclosure is not limited thereto.

Further, the metal foam 220 according to FIG. 6C shows another embodiment in which some of the inner pores 225 are waterproof-coated with a waterproof material 229.

As described above, in one embodiment of the present disclosure, the top face and a portion of the side face of the metal foam 220 are covered with the water-proof layer 210, such that the moisture invasion into the metal foam 220 is prevented as much as possible.

In order to further increase the waterproof performance, water repellency can be additionally imparted to the metal foam by coating the inner pores 225 of the metal foam 220 with a waterproof material such as an organic material.

In this case, when a percentage of the organic material coating inside the metal foam 220 is set to around 2%, the internal water-repellent function of the metal foam 220 can be maximized while minimizing the deterioration in the shock absorbing function of the metal foam 220.

In one example, in this case, when it is desirable to maximize the inner waterproof function of the metal foam 220, the inner pores 225 of the metal foam 220 can be fully filled with the waterproof material.

The waterproof material can include an organic material. The organic material can include an acrylic organic material or a polyurethane organic material. However, the present disclosure is not limited thereto.

Various additional components for operating the display panel 100 can be disposed under the cushion plate 200.

The various additional components can be mounted on or connected to a connecting part such as a flexible circuit board and can be disposed on the rear face of the display panel 100.

For example, the flexible circuit board connected to one distal end of the display panel 100 can be bent from one edge area (or one periphery area) of the display device 1 toward the rear face of the display panel 100.

Alternatively, one distal end of the display panel 100 can be bent toward the rear face of the display panel 100, so that various additional components can be disposed on the rear face of the display panel 100.

A driving integrated circuit can be disposed under the cushion plate 200.

For example, the driving integrated circuit can be mounted on the display substrate in a COP (Chip On Plastic) manner. However, the present disclosure is not limited thereto.

The driving integrated circuit generates a data signal and a gate control signal based on image data and a timing synchronization signal supplied from an external host driving system. Further, the driving integrated circuit can supply the data signal to the data line of each pixel through the display pad, and can supply the gate control signal to the gate driving circuitry through the display pad.

That is, the driving integrated circuit can be mounted on a chip mounted area defined on the display substrate and can be electrically connected to the display pad, and can be connected to a signal line of each of a gate driving circuitry and a pixel array disposed on the display substrate.

The display pad can be disposed at a distal end of the display substrate on which the driving integrated circuit is mounted. A plurality of display pads can be formed.

The display pad can be disposed on the rear face of the display substrate and can be electrically connected to the flexible circuit board on which a circuit board is mounted.

The flexible circuit board can be electrically connected to the display pad disposed at the distal end of the display substrate via a film attaching process using a conductive adhesive layer, and thus can be disposed on the rear face of the display panel.

In this case, the conductive adhesive layer can include ACF (Anisotropic Conductive Film) by way of example.

The circuit board can supply the image data and the timing synchronization signal supplied from the host driving system to the driving integrated circuit, and can respectively supply voltages for driving the pixel array, the gate driving circuitry, and the driving integrated circuit thereto.

The display module according to an embodiment of the present disclosure as described above can include the display panel, and the cushion plate disposed on the rear face of the display panel, and the cushion plate can include the metal foam and the water-proof layer.

In this case, the metal foam can include the body and the chamfer along the edge (or the periphery) of the body, and the water-proof layer can be disposed on the rear face of the metal foam to cover the rear face of the body and the chamfer.

The chamfer can be disposed on the rear face of the body.

The chamfer can be formed by removing at least a portion of the rear face and at least a portion of the side face of the metal foam.

The chamfer can include at least one of an inclined face, a right angled face, and a curved face.

The chamfer can be formed along an entire circumference of the body.

A thickness of the chamfer can be smaller than or equal to two third (⅔) of a thickness of the body.

The water-proof layer can include an organic material and can cover an entire side face of the body.

A side face (or A side surface) of the body can be divided into a first side face (or a first side surface) comprising the chamfer of the metal foam and a second side face (or a second side surface) free of the chamfer, the water-proof layer of the cushion plate can cover only the rear face (or the rear surface) of the metal foam and the first side face (or the first side surface), but may not cover the second side face (or the second side surface).

The cushion plate can include an embossed layer. The embossed layer, the metal foam, and the water-proof layer can be sequentially stacked in this order toward the rear face of the display panel.

The embossed layer can include a base substrate and a first adhesive layer and a second adhesive layer can be respectively disposed on both opposing faces of the base substrate, The first adhesive layer can have an embossed pattern, and the second adhesive layer can be coupled to the metal foam.

The metal foam can have a porous metal structure having a plurality of pores.

The metal foam can further include a heat-dissipation material therein.

At least some of the pores can be coated with a waterproof material, and the waterproof material includes an organic material.

The plurality of pores of the metal foam can be fully filled with the waterproof material.

The embossed layer can have a thickness of at least 40 μm.

A thickness of the metal foam can be in a range of 20 μm to 200 μm, and a thickness of the cushion plate is in a range of 80 μm to 260 μm.

The display device according to an embodiment of the present disclosure includes the cover member, the display module according to an embodiment of the present disclosure coupled to the rear face of the cover member, and the frame disposed on the rear face of the display module to support the cover member.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The invention claimed is:

1. A display device, comprising:
a display panel;
a cushion plate on the display panel; and
a continuous foam layer that is a member of the cushion plate, the foam layer having a portion with a reduced thickness at an outer edge of the continuous foam layer.

2. The display device of claim 1, wherein the portion with the reduced thickness includes an inclined surface at the outer edge of the continuous foam layer.

3. The display device of claim 1, wherein the continuous foam layer has a body with a top surface and a side surface, and
wherein the outer edge is at an interface between the top surface and the side surface of the body of the continuous foam layer.

4. The display device of claim 3, wherein the portion with the reduced thickness includes an inclined surface at the interface between the top surface and the side surface.

5. The display device of claim 1, wherein the cushion plate further includes an adhesive layer on at least part of the portion with the reduced thickness of the continuous foam layer.

6. The display device of claim 1, wherein the portion with the reduced thickness corresponds to an inclined surface, a vertical or horizontal surface, or a curved surface relative to a body of the continuous foam layer.

7. The display panel of claim 1, wherein the cushion plate further includes an adhesive layer on at least a portion of a top surface of the continuous foam layer corresponding to the portion with the reduced thickness.

8. The display panel of claim 1, wherein the foam layer is a metal foam layer.

9. A display device, comprising:
a display panel; and
a cushion plate on the display panel, wherein the cushion plate includes a foam layer having a recessed surface relative to a body of the foam layer.

10. The display device of claim 9, wherein the cushion plate further includes an adhesive layer corresponding to the recessed surface.

11. The display device of claim 9, wherein the recessed surface is at an outer edge of the body of the foam layer.

12. The display device of claim 9, wherein the recessed surface includes a portion of a top surface of the body of the foam layer and a portion of a side surface of the body of the foam layer.

13. The display device of claim 9, wherein the cushion plate further includes an adhesive layer on the portion of the top surface.

14. The display device of claim 9, wherein a thickness of the recessed surface is $2/3$ or less than a thickness of the body of the foam layer.

15. The display device of claim 9, wherein the foam layer s a metal foam layer.

16. A display device, comprising:
a display panel; and
a cushion plate on the display panel, the cushion plate including:
a foam layer, the foam layer having a top surface, a bottom surface, a side surface, and an inclined surface; and
a layer on at least a portion of the inclined surface.

17. The display device of claim 16, wherein the inclined surface of the foam layer corresponds to a portion of the foam layer having a reduced thickness at an outer edge of the foam layer.

18. The display device of claim 17, wherein the outer edge is between the top surface and the side surface or between the side surface and the bottom surface.

19. The display device of claim 14, wherein the inclined surface of the foam layer is a recessed surface relative to the top surface, and
wherein the layer is an adhesive layer.

20. The display device of claim 17, wherein the recessed surface is a curved surface.

21. The display device of claim 14, wherein the inclined surface is a chamfered surface.

22. The display device of claim 14, wherein the layer is on an entirety of the inclined surface of the foam layer.

23. A display device, comprising:
a display panel;
a cushion plate on the display panel, the cushion plate including a foam layer; and
a case coupled to the display panel and the cushion plate,
wherein a first distance between a first portion of the case and a first portion of the foam layer is greater than a second distance between a second portion of the case and a second portion of the foam layer.

24. The display device of claim 23, wherein at least one of the first portion and the second portion of the foam layer is an outer edge of the foam layer.

25. The display device of claim 23, further comprising:
an embossed layer between the foam layer and the display panel.

26. The display device of claim 25, wherein the embossed layer includes at least one adhesive layer.

27. The display device of claim 25, wherein the embossed layer is disposed on the foam layer and follows a contour of the foam layer.

28. The display device of claim 25, wherein the embossed layer includes a base substrate, a first adhesive layer, and a second adhesive layer.

29. The display device of claim 28, wherein the first adhesive layer and the second adhesive layer are arranged on opposite faces of the base substrate.

30. The display device of claim 25, wherein the embossed layer has an embossed pattern with an uneven surface.

31. The display device of claim 25, wherein the embossed layer has an embossed pattern with a plurality of protrusions.

32. The display device of claim 23, wherein the display panel includes a back plate, the display device further comprising:
an embossed layer in contact with the back plate.

33. The display device of claim 23, further comprising:
a cover on the display panel; and
an adhesive layer between the cover and the display panel.

34. The display device of claim 23, further comprising:
a protection layer on the foam layer.

35. The display device of claim 34, wherein at least one of the first portion and the second portion of the foam layer is an inclined surface of the foam layer, and
wherein the protection layer overlaps the inclined surface of the foam layer.

36. The display device of claim 23, further comprising:
a polarizing film between the display panel and the cushion plate.

37. The display device of claim 23, wherein at least one of the first portion and the second portion of the foam layer corresponds to a chamfered surface of the foam layer.

* * * * *